(12) United States Patent
Kramer et al.

(10) Patent No.: US 7,930,654 B2
(45) Date of Patent: Apr. 19, 2011

(54) SYSTEM AND METHOD OF CORRECTING ERRORS IN SEM-MEASUREMENTS

(75) Inventors: Uwe Kramer, Dresden (DE); Robert Wildfeuer, Dresden (DE)

(73) Assignee: Qimonda AG, München (DE)

( * ) Notice: Subject to any disclaimer, the term of this patent is extended or adjusted under 35 U.S.C. 154(b) by 327 days.

(21) Appl. No.: 12/112,835

(22) Filed: Apr. 30, 2008

(65) Prior Publication Data

US 2009/0276735 A1    Nov. 5, 2009

(51) Int. Cl.
*G06F 17/50* (2006.01)
(52) U.S. Cl. ............. 716/51; 716/50; 716/53; 716/54
(58) Field of Classification Search ............. 716/8–10, 716/19–21, 50–54; 430/5, 30
See application file for complete search history.

(56) References Cited

U.S. PATENT DOCUMENTS

| | | | |
|---|---|---|---|
| 6,709,793 B1 * | 3/2004 | Brankner et al. | 430/5 |
| 6,727,028 B2 * | 4/2004 | Kotani et al. | 430/5 |
| 7,506,285 B2 * | 3/2009 | Al-Imam et al. | 716/106 |
| 7,519,943 B2 * | 4/2009 | Futatsuya | 716/21 |

* cited by examiner

*Primary Examiner* — Nghia M Doan
(74) *Attorney, Agent, or Firm* — Cohen Pontani Liebermsn & Pavane LLP

(57) ABSTRACT

Embodiments of the invention relate to correcting errors in scanning electron measurements during measuring structural dimensions of an integrated circuit for optical proximity correction by extracting feature edges of a test pattern within an image, calculating at least one scaling error of the image by comparing the extracted feature edges of assist structures with a layout pattern, modifying feature edges of test structures within the test pattern by incorporating the at least one scaling error so as to at least partially compensate the scaling errors, and verifying a model for optical proximity corrections and/or model input data by using the modified feature edges of the test structures.

17 Claims, 5 Drawing Sheets

U.S. 7,930,654 B2

SYSTEM AND METHOD OF CORRECTING ERRORS IN SEM-MEASUREMENTS

TECHNICAL FIELD

Embodiments of the invention relate to correcting errors in scanning electron measurements during measuring structural dimensions of an integrated circuit for optical proximity correction.

BACKGROUND

Currently, there are several concepts known in the art which address the problem of increasing the resolution capabilities. According to a first example, off-axis illumination in the projection system of the projection apparatus together with sub-resolution sized assist features is used. In a second example, the concept of alternating phase shift masks is employed so as to enhance the resolution capabilities of the projection apparatus.

In order to achieve dimensional accuracy of the mask pattern during imaging on a substrate, sub-resolution sized assist features or structures for optical proximity correction can be included in the mask pattern. These features are additional structures as, e.g., serifs or hammerheads, or are placed in close proximity to the original mask features. Size, shape and placement of these structures are usually determined by using a simulation model of the photolithographic projection. Such a simulation model is usually called an OPC model or model for optical proximity correction.

Usually, a model for optical proximity correction requires input data which can be derived by a measurement using scanning electron microscopy (SEM). In this respect, a wafer can be processed and the resulting pattern after optical image projection on a resist layer can be measured with the scanning electron microscope. In order to provide quantitatively reliable input data, errors during SEM-measurements should be low.

Accordingly, there is a need in the art to increase and/or correct errors in scanning electron measurements during measuring structural dimensions of an integrated circuit for optical proximity correction.

SUMMARY OF THE INVENTION

The system of correcting scaling errors in scanning electron measurements provides a layout pattern with test structures and a plurality of assist structures, a lithographic apparatus capable of projecting the layout pattern onto a patterning layer by providing a mask with the layout pattern so as to create a test pattern, and a scanning electron microscope capable of recording an image of the test pattern. A calculator is provided capable of extracting feature edges of the test pattern within the image, calculating at least one scaling error of the image during the step of recording by comparing the extracted feature edges of the assist structures with the layout pattern and modifying feature edges of the test structures within the test pattern by incorporating the at least one scaling error.

A method of correcting scaling errors in scanning electron measurements is provided with the step of providing a layout pattern with test structures and a plurality of assist structures. The layout pattern is projected onto a patterning layer by providing a mask with the layout pattern so as to create a test pattern. An image of the test pattern is recorded with a scanning electron microscope. Feature edges of the test pattern within the image are extracted. At least one scaling error of the image is calculated by comparing the extracted feature edges of the assist structures with the layout pattern. Feature edges of the test structures are modified by incorporating the at least one scaling error.

DETAILED DESCRIPTION OF ILLUSTRATIVE EMBODIMENTS

Embodiments of methods and systems for correcting scaling errors in scanning electron measurements are discussed in detail below. It is appreciated, however, that the present invention provides many applicable inventive concepts that can be embodied in a wide variety of specific contexts. The specific embodiments discussed are merely illustrative of specific ways and do not limit the scope of the invention.

In the following, embodiments of the method and the system are described with respect to improving dimensional accuracy during simulation of lithographic projection of a layer of an integrated circuit. The embodiments, however, might also be useful in other respects, e.g., pattern fidelity of two-dimensional structures, improvements in process window calculations, improvements in identifying critical parts of a layout of a pattern, yield enhancement techniques or layout simulation capabilities.

Furthermore, it should be noted that the embodiments are described with respect to line-space-patterns but might also be useful in other respects including but not limited to dense patterns, semi dense patterns or patterns with isolated lines and combinations between them all. Lithographic projection can also be applied during manufacturing of different products, e.g., semiconductor circuits, thin film elements. Other products, e.g., liquid crystal panels or the like might be produced as well.

Figure 1:
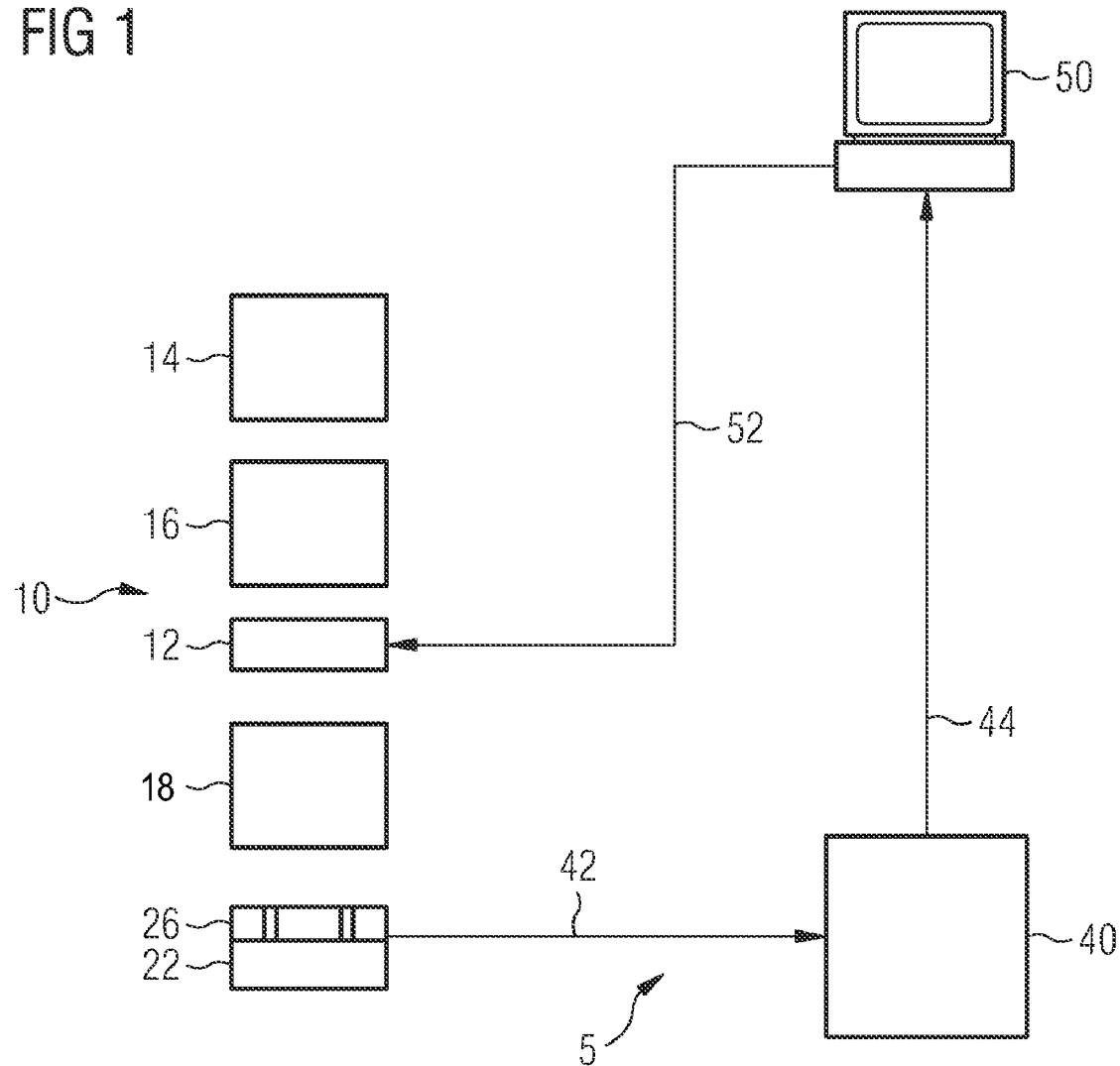
FIG. 1 illustrates a system for correcting scaling errors according to an embodiment.

With respect to FIG. 1, a set-up of a system for correcting scaling errors 5 is shown in a side view. It should be appreciated that FIG. 1 merely serves as an illustration, i.e., the individual components shown in FIG. 1 neither describe the full functionality of a system for correcting scaling errors 5 nor are the elements shown true scale.

The system for correcting scaling errors 5 includes a projection apparatus 10 comprises a light source 14, which is, e.g., an Excimer laser with 193 nm wavelength. An illumination optic 16 projects the light coming from the light source 14 through a photo mask 12 into an entrance pupil of the projection system. The illumination optic 16 arranged between the light source 14 and photo mask 12.

It should be noted that the described embodiment uses a projective optical system in the UV range employing a certain demagnification. However, other lithographic system including proximity projection, reflective projection or the like employing various wavelengths from the visible to ultraviolet to extreme ultraviolet range can be employed.

The photo mask 12 comprises a mask pattern, i.e., being composed of light absorptive or light attenuating elements. Light absorptive elements can be provided by, e.g., chrome elements. Light attenuating elements can be provided by, e.g., molybdenum-silicate elements. The mask pattern is derived from a layout pattern which can be provided by a computer aided design system, in which structural elements of the layout pattern are generated and stored.

The computer aided design system can be operated on a computer 50, which outputs data of the mask pattern for manufacturing the photo mask 12, as schematically indicated by arrow 52 in FIG. 1.

The light passing the photo mask 12, i.e., not being blocked or attenuated by the above mentioned elements, is projected by a projection lens 18 onto the surface of a semiconductor wafer 22. The pattern projected on the semiconductor wafer 22 is usually de-magnified, i.e., scaled down by factor of 4 or 5. For the optical characteristics of the projection apparatus 10, the main contributions are determined by the light source 14, the illumination optic 16, and the projection lens 18 which are commonly denoted as projection system.

A photo resist film layer 26 is deposited on the semiconductor wafer 22. Onto the resist film layer 26, the mask pattern 12 is projected. After developing the photo resist film layer 26, a three dimensional resist pattern is formed on the surface of the semiconductor wafer 22 by removing those parts of the photo resist film layer 26 which are exposed with an exposure dose above the exposure dose threshold of the resist film layer 26.

Before the layout pattern is fabricated in a high volume manufacturing process, several set-up procedures are performed including optimizing the illumination process and implementing so called resolution enhancement techniques (RET) which improve the resolution capabilities of the lithographic projection apparatus.

In order to perform the necessary calculations for the photolithographic projection step, several sub-models are included or added to an OPC model, as, for example, a model for forming an aerial image including the actual pattern of the photo mask and a model of the resist exposure. In one possible strategy, the result of the simulation is returned to the layout program so as to alter the geometric structures described above before production of photo mask 12.

Performance and reliability of simulations for optical proximity correction can be increased by including a measurement of test pattern data which were derived by using the lithographic projection apparatus 10. Furthermore, data for optical proximity correction can be derived by various models which use the edge contours of test pattern data.

In order to perform a measurement of test patterns, a scanning electron microscope 40 can be employed which provides test pattern data by scanning an electron beam on the test pattern. In order to do so, the substrate 22 having the patterned resist film layer 26 is transferred to the scanning electron microscope 40 as schematically indicated by arrow 42 in FIG. 1.

The SEM images are further analyzed and the required parameters are derived from these images. This can be performed by transferring image data of SEM images to computer 50, as schematically indicated by arrow 44 in FIG. 1. It should be noted that it is also conceivable to provide one or more additional computing units which can be connected by a network or the like to computer 50, for example.

However, SEM images taken from automatic CD measurements in semiconductor industry are subject to systematic errors which are caused by SEM tool setup, scanner setup on which the test sample is located, and the mask process. These errors are: scaling error in X and Y, positioning error in X and Y, rotation error or aberrations like perpendicularity, tilt, linearity or the like.

A possible procedure for optical proximity correction setup and verification can use extracted contours from structures in the SEM images. In order to develop the model for optical proximity correction, the extracted edge contours or the SEM images should be corrected for systematic errors.

Usually, CD measurement data do not contain the position information and are therefore also subjected to the scaling error. The scaling error on a single CD measurement can be neglected for a small test structure. Normal scaling offsets are within 1% to 2% which is 1 nm for a single line of 100 nm.

For edge contour extractions of areas of up to about 5 µm or even more the scaling error cannot be neglected anymore. The placement error of the contours can become larger than about 100 nm (+/−50 nm) only because of the scaling error. Conventional scaling correction methods do stretch the SEM image or the contours. In this case proximity effects from the exposure are calculated out which gives a worse OPC correction.

In the following, assist structures around the test structures for optical proximity correction are included in the layout pattern, in order to allow correction of scaling errors.

Figure 2:
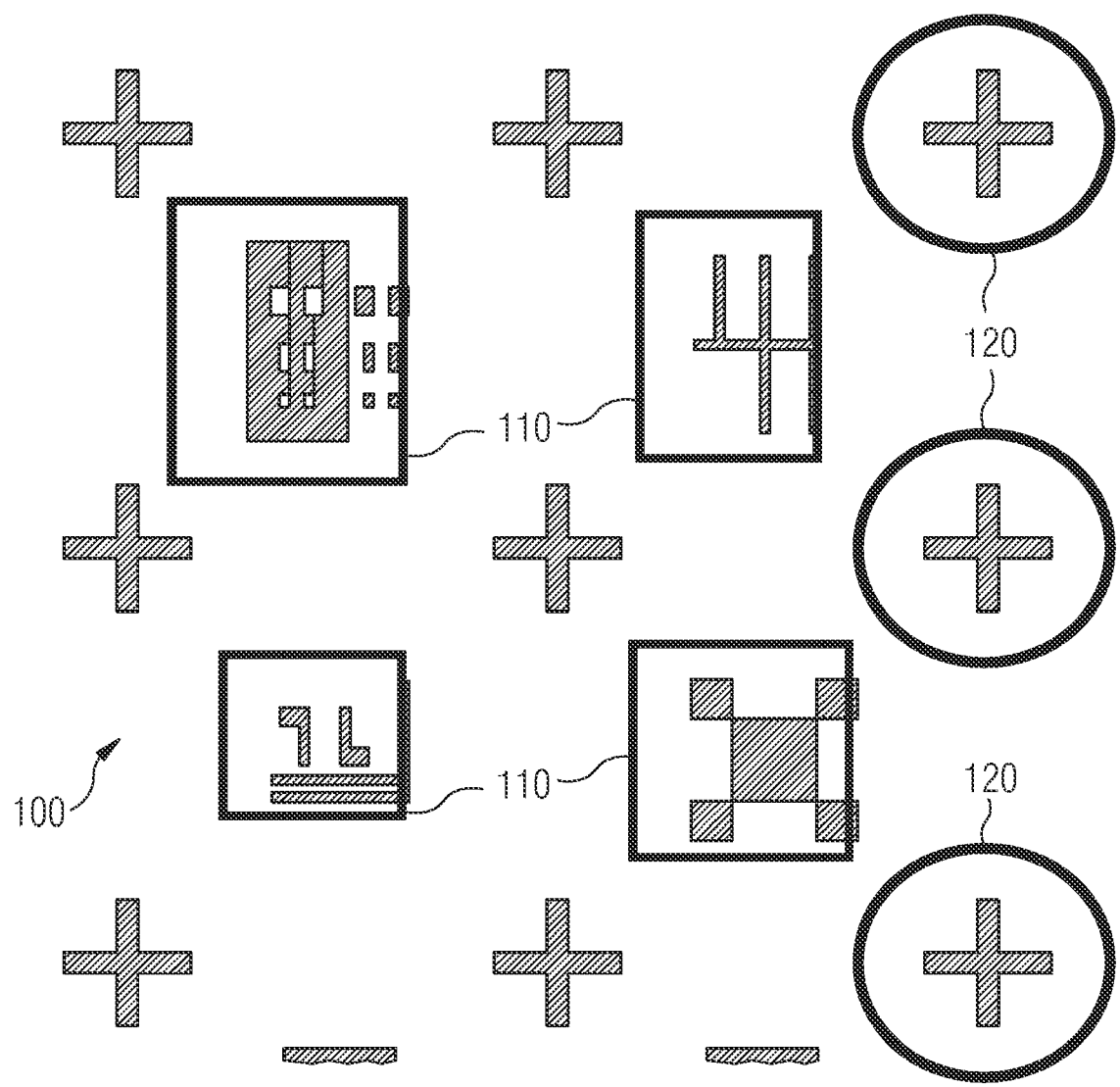
FIG. 2 illustrates a layout pattern in a top view according to an embodiment.

Making now reference to FIG. 2, an image 100 of a test pattern as taken by a scanning electron microscope after projecting the layout pattern onto the patterning or photo resist layer is shown. The image 100 is stored in a design database, e.g., in GDS data format. Other formats, like OASIS or DBX or any other design format suitable for computer aided designs can be used as well. The layout pattern comprises test structures 110 used for OPC modelling and assist structures 120.

By comparing the extracted feature edges of the assist structures 120 with the test pattern, a scaling error of the image 100 can be calculated. As shown in FIG. 2, the assist structures 120 are arranged periodically around the test structures 110. Furthermore, the assist structures 120 can be arranged at corners surrounding the test structures 110.

With the assist structures 120 it is possible to at least partially correct a scaling error by correction of image scaling, correction of a positioning error in a first direction, by correction of a positioning error in a second direction being different to the first direction, and by correction of an image rotation error. Furthermore, perpendicularity can be corrected as well.

After an SEM-image is taken, edges of all structures can be extracted to a GDS data set as an electronic data representation for storing the feature edges. Differentiation between assist structures and OPC test structures will be applied. Assist structures and OPC structures are placed in different GDS layers to allow automatic assignment.

Using the edges of the periodic assist features only the correction for scaling and/or perpendicularity will be applied for all edges including the edges of the OPC test structures. By applying the same procedures for systematic errors will be eliminated. Using the GDS electronic data representation, feature edges within the OPC model can be calculated or verified.

In summary, implementing periodic assist features around OPC test structures correction can be done for the following scaling errors:
1. Image scaling,
2. Positioning error in X and Y, and
3. Rotation error.

Figure 3:
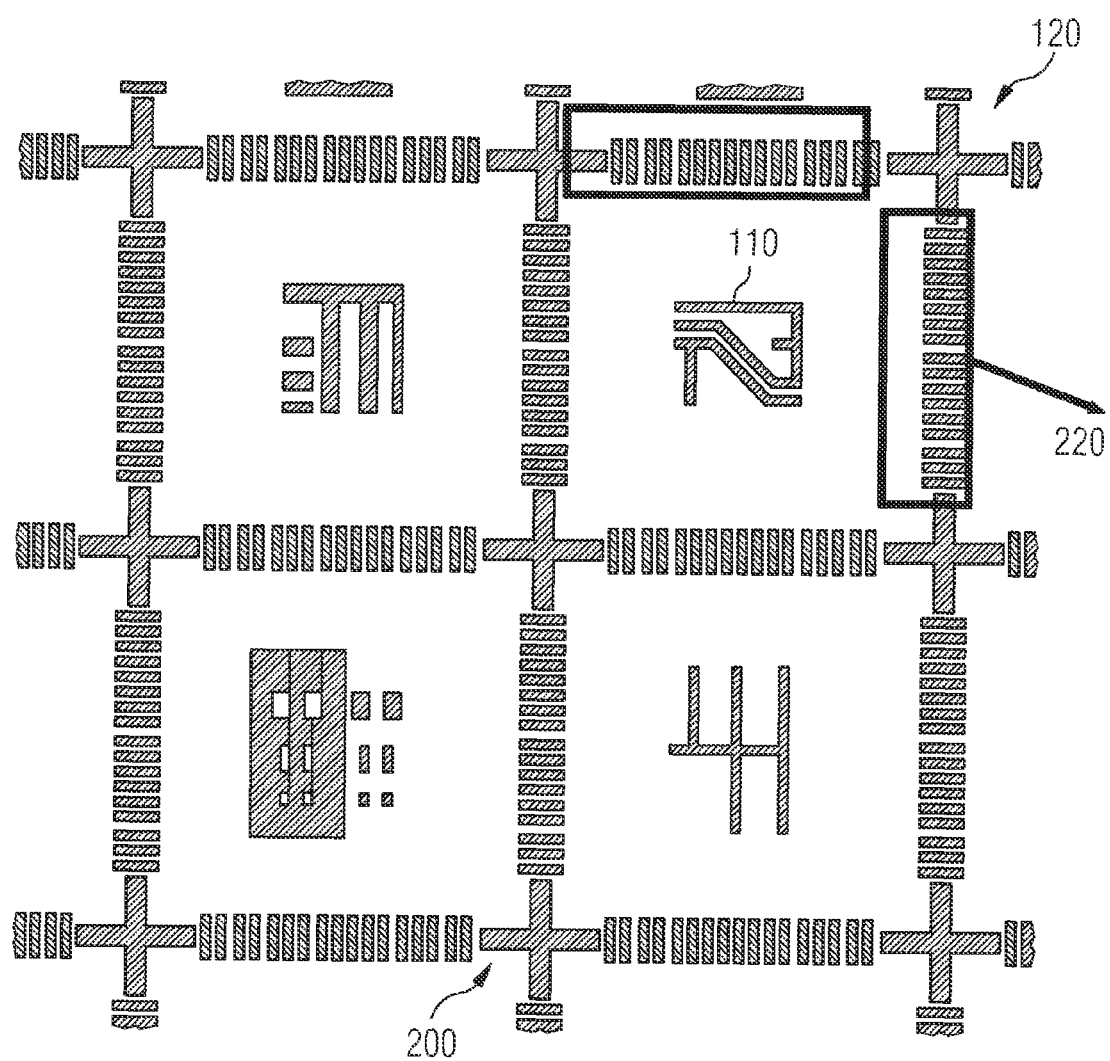
FIG. 3 illustrates a layout pattern in a top view according to an embodiment.

Making now reference to FIG. 3, a further image 200 of a test pattern as taken by a scanning electron microscope after projecting the layout pattern onto the patterning or photo resist layer is shown as stored in a design data base format. The layout pattern comprises test structures 110 used for OPC modelling and assist structures 120.

As shown in FIG. 3, in addition to the periodic assist structures 120 which were described above, between the assist structures 120 at the corners, further assist structures 220 are placed as gratings in X and Y direction. With these gratings it is possible to correct perpendicularity, tilt, and/or linearity errors of the image 200. Additionally the layout of the further assist features is insensitive to different proximities.

Figure 4:
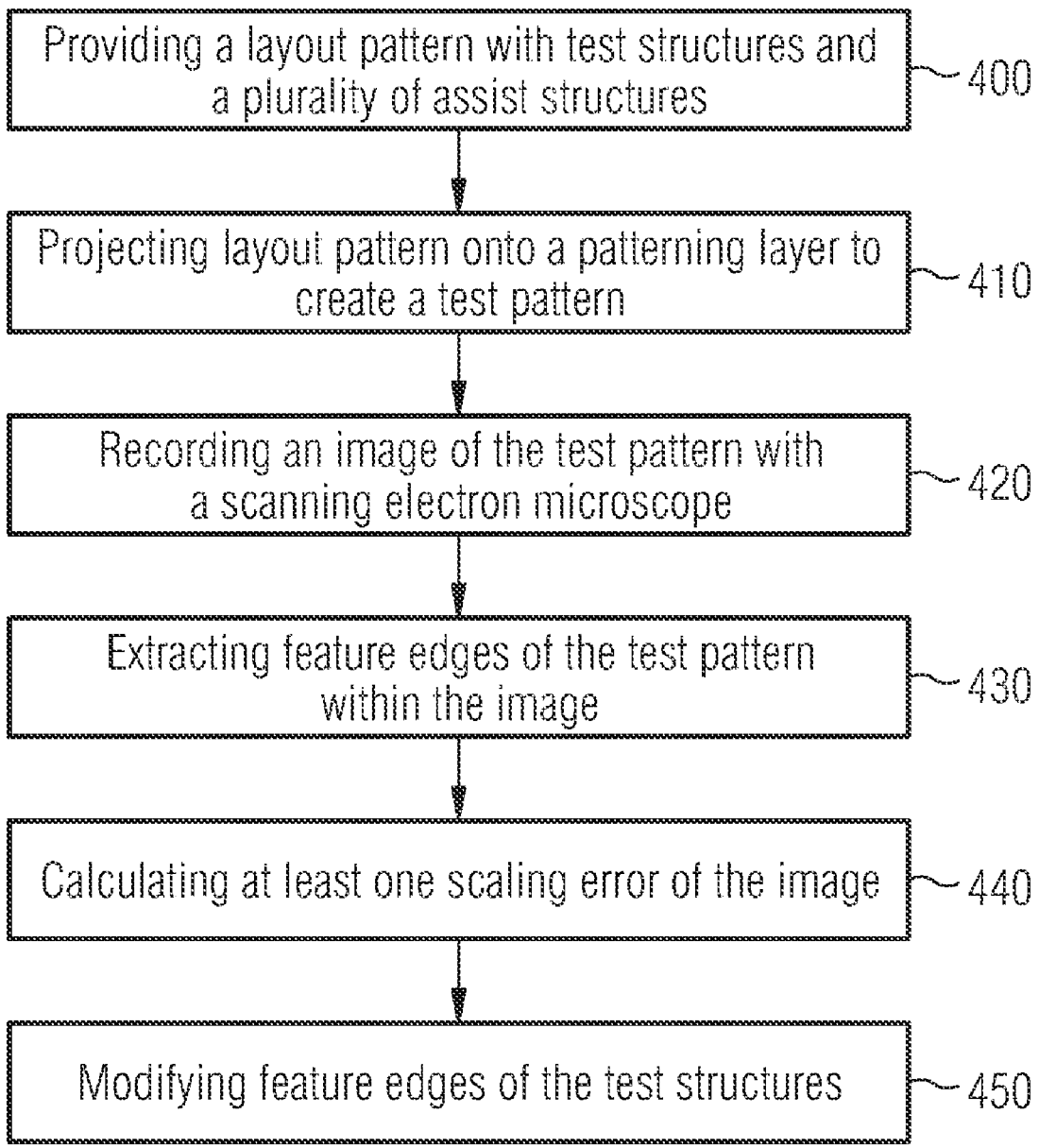
FIG. 4 illustrates in a flow chart, method steps according to an embodiment.

In FIG. 4, a flow diagram is shown with individual process steps capable of correcting scaling errors in scanning electron measurements.

In step 400, a layout pattern comprising test structures and a plurality of assist structures is provided.

In step 410, the layout pattern is projected onto a patterning layer by providing a mask with the layout pattern so as to create a test pattern.

In step 420, an image of the test pattern is recorded with a scanning electron microscope.

In step 430, feature edges of the test pattern within the image are extracted.

In step 440, at least one scaling error of the image is calculated during the step of recording by comparing the extracted feature edges of the assist structures with the layout pattern.

In step 450, feature edges of the test structures within the test pattern are modified by incorporating the at least one scaling error so as to at least partially compensate the scaling errors.

Figure 5:
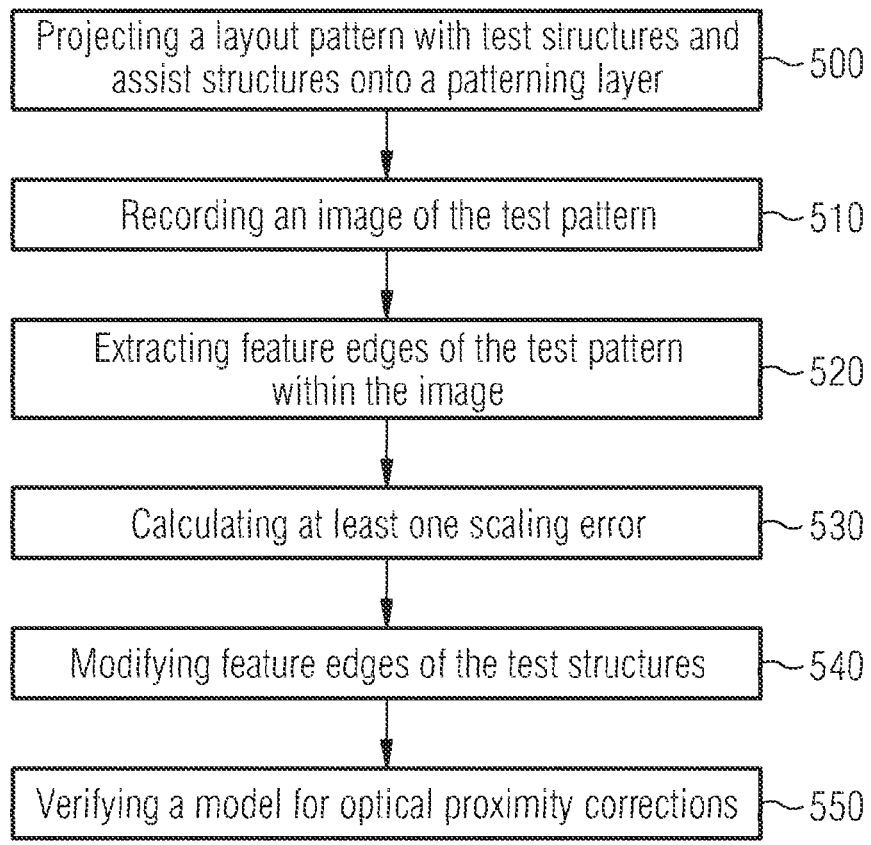
FIG. 5 illustrates in a flow chart, method steps according to an embodiment.

In FIG. 5, a flow diagram is shown with individual process steps capable of correcting scaling errors in scanning electron measurements.

In step 500, a layout pattern comprising test structures and a plurality of assist structures is provided and the layout pattern is projected onto a patterning layer by providing a mask with the layout pattern so as to create a test pattern.

In step 510, an image of the test pattern is recorded with a scanning electron microscope.

In step 520, feature edges of the test pattern within the image are extracted.

In step 530, at least one scaling error of the image is calculated during the step of recording by comparing the extracted feature edges of the assist structures with the layout pattern.

In step 540, feature edges of the test structures within the test pattern are modified by incorporating the at least one scaling error so as to at least partially compensate the scaling errors.

In step 550, a model for optical proximity corrections is verified by using the modified feature edges of the test structures.

It should be noted that the process steps according to FIG. 4 and 5 can at least partially be performed on computer 50, as explained with respect to FIG. 1.

Figure 6:
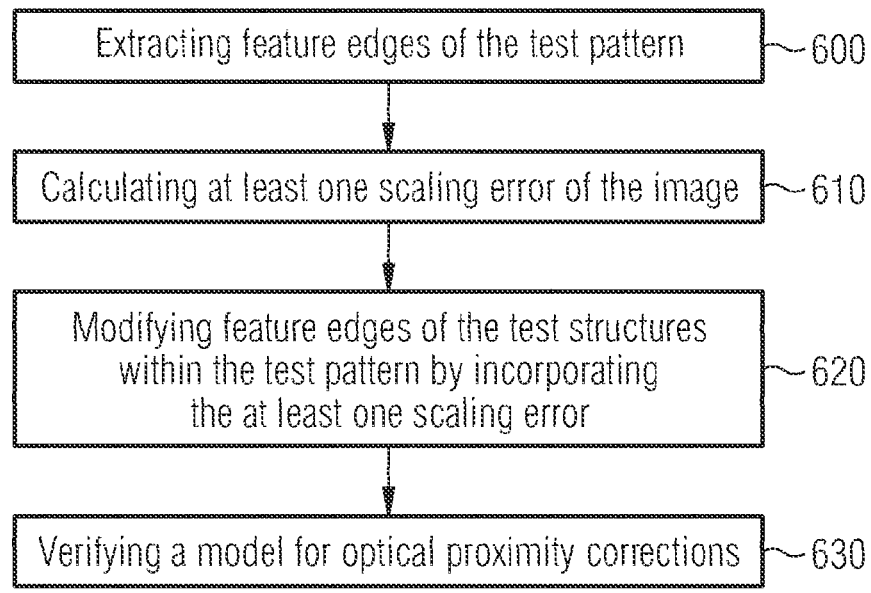
FIG. 6 illustrates in a flow chart, method steps according to an embodiment.

The instructions necessary for performing respective operations of computer 50 can be stored on a computer readable medium. Accordingly, the computer readable medium can include instructions capable of performing the following steps on a computer, as shown with respect to FIG. 6.

In step 600, extracting feature edges of a test pattern within an image is performed.

In step 610, calculating at least one scaling error of the image by comparing the extracted feature edges of assist structures with a layout pattern is performed.

In step 620, modifying feature edges of test structures within the test pattern by incorporating the at least one scaling error so as to at least partially compensate the scaling errors is performed.

In step 630, verifying a model for optical proximity corrections by using the modified feature edges of the test structures is performed.

Having described embodiments of the invention, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method of correcting scaling errors, the method comprising:
    providing a photomask having a layout pattern comprising test structures and a plurality of assist structures;
    forming a test pattern by projecting the layout pattern of the photomask onto a patterning layer;
    recording an image of the test pattern with a scanning electron microscope;
    extracting feature edges of the test pattern within the image;
    differentiating between patterning layer assist structures and patterning layer test structures during the extraction;
    calculating at least one scaling error of the image by comparing the extracted feature edges of the test pattern with the layout pattern; and
    modifying feature edges of the test structures within the layout pattern by correcting the at least one scaling error so as to at least partially compensate the scaling errors,
    wherein an electronic data representation is capable of providing at least two sub-representations, and
    storing the assist structures in a first of the at least two sub-representations and the test structures in a second of the at least two sub-representations.

2. The method according to claim 1, wherein an electronic data representation is provided capable of storing the feature edges.

3. The method according to claim 1, wherein the electronic data representation and the at least two sub-representations are provided as layers of a data format of a computer aided design system.

4. A method of correcting scaling errors, the method comprising:
    forming a test pattern by projecting a layout pattern of a photomask onto a patterning layer, the layout pattern comprising test structures and a plurality of assist structures;
    recording an image of the test pattern with a scanning electron microscope;
    extracting feature edges of the test pattern within the image;
    differentiating between patterning layer assist structures and patterning layer test structures;
    calculating at least one scaling error of the image by comparing the extracted feature edges of test pattern with the layout pattern;

modifying feature edges of the test structures within the layout pattern by correcting the at least one scaling error so as to at least partially compensate the scaling errors; and verifying a model for optical proximity corrections by using the modified feature edges of the test structures, wherein an electronic data representation is capable of providing at least two sub-representations, and storing the assist structures in a first of the at least two sub-representations and the test structures in a second of the at least two sub-representations.

5. The method according to claim 4, wherein at least partially compensating the scaling error includes correcting image scaling in a first and/or second direction.

6. The method according to claim 4, wherein at least partially compensating the scaling error includes correcting a positioning error in a first direction.

7. The method according to claim 6, wherein at least partially compensating the scaling error further includes correcting a positioning error in a second direction different than the first direction.

8. The method according to claim 4, wherein at least partially compensating the scaling error includes correcting an image rotation error.

9. The method according to claim 4, wherein at least partially compensating the scaling error includes correcting perpendicularity, tilt, and/or linearity of the image.

10. The method according to claim 4, wherein the assist structures are arranged periodically around the test structures.

11. The method according to claim 10, wherein the assist structures are arranged at corners surrounding the test structures.

12. The method according to claim 10, wherein the assist structures are arranged having a grating.

13. A system comprising:
means for forming a test pattern by projecting a layout pattern of a photomask onto a patterning layer, the layout pattern comprising test structures and a plurality of assist structures;
means for recording an image of the test pattern with a scanning electron microscope;
means for extracting feature edges of the test pattern within the image;
means for differentiating between patterning layer assist structures and patterning layer test structures;
means for calculating at least one scaling error of the image by comparing the extracted feature edges of the test pattern with the layout pattern; and
means for modifying feature edges of the test structures within the test layout by correcting the at least one scaling error so as to at least partially compensate the scaling errors,
wherein an electronic data representation is capable of providing at least two sub-representations, and
a memory for storing the assist structures in a first of the at least two sub-representations and the test structures in a second of the at least two sub-representations.

14. A system comprising:
a lithographic apparatus capable of projecting a layout pattern onto a patterning layer by illuminating a photomask with the layout pattern so as to create a test pattern, the layout pattern comprising test structures and a plurality of assist structures;
a scanning electron microscope capable of recording an image of the test pattern;
a processor capable of extracting feature edges of the test pattern within the image, differentiating between patterning layer assist structures and patterning layer test structures, calculating at least one scaling error of the image by comparing extracted feature edges of the test pattern with the layout pattern, modifying feature edges of the test structures within the test layout by correcting the at least one scaling error so as to at least partially compensate the scaling errors, and verifying a model for optical proximity corrections by using the modified feature edges of the test structures,
wherein an electronic data representation is capable of providing at least two sub-representations, and
a memory for storing the assist structures in a first of the at least two sub-representations and the test structures in a second of the at least two sub-representations.

15. The system according to claim 14, wherein the processor uses an electronic data representation capable of storing the feature edges.

16. A nontransitory computer readable medium, the nontransitory computer readable medium including instructions capable of performing the following steps on a computer:
extracting feature edges of a test pattern of a patterning layer within an image;
differentiating between patterning layer assist structures and patterning layer test structures during the extraction;
calculating at least one scaling error of the image by comparing extracted feature edges of assist structures of the test pattern with a layout pattern of a photomask;
modifying feature edges of test structures within the layout pattern by correcting the at least one scaling error so as to at least partially compensate the scaling errors; and
verifying a model for optical proximity corrections by using the modified feature edges of the test structures,
wherein an electronic data representation is capable of providing at least two sub-representations, and
storing the assist structures in a first of the at least two sub-representations and the test structures in a second of the at least two sub-representations.

17. The computer readable medium according to claim 16, further comprising instructions capable of performing the step of verifying model input data.

* * * * *